(12) United States Patent
Wu et al.

(10) Patent No.: US 11,165,440 B1
(45) Date of Patent: Nov. 2, 2021

(54) SYSTEMS AND METHODS FOR GEOMETRIC PARTITIONING IN OBJECT STORAGE

(71) Applicant: Tsinghua University, Beijing (CN)

(72) Inventors: Yongwei Wu, Beijing (CN); Yingdi Shan, Beijing (CN); Kang Chen, Beijing (CN); Tuoyu Gong, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 32 days.

(21) Appl. No.: 16/900,206

(22) Filed: Jun. 12, 2020

(51) Int. Cl.
*H03M 13/15* (2006.01)
*G06F 3/06* (2006.01)

(52) U.S. Cl.
CPC ........ *H03M 13/154* (2013.01); *G06F 3/0619* (2013.01); *G06F 3/0644* (2013.01); *G06F 3/0673* (2013.01)

(58) Field of Classification Search
CPC .... G06F 3/0644; G06F 3/0673; G06F 3/0619; G06F 3/037; G06F 11/1048; H03M 13/154
See application file for complete search history.

(56) References Cited

U.S. PATENT DOCUMENTS

| | | | |
|---|---|---|---|
| 2016/0139980 A1* | 5/2016 | Cowling | G06F 11/1048 714/763 |
| 2019/0114094 A1* | 4/2019 | Ki | G06F 3/067 |
| 2019/0384497 A1* | 12/2019 | Ben Dayan | G06F 3/0688 |

* cited by examiner

*Primary Examiner* — Shelly A Chase
(74) *Attorney, Agent, or Firm* — IPro, PLLC; Xiaomin Huang

(57) ABSTRACT

Systems and methods are provided for an erasure coding object storage system. One method may comprise receiving an object for storing in an erasure coding object storage system, partitioning the object into a plurality of chunks including a first chunk and a second chunk. The first chunk may have a first chunk size and fall into a first bucket, the second chunk may have a second chunk size equal to the first chunk size multiplied by a ratio q that is larger than one and fall into a second bucket. The method may further comprise encoding the first bucket using a regenerating code with the first chunk size, encoding the second bucket using the regenerating code with the second chunk size and storing the encoded first and second buckets in a plurality of nodes of the erasure coding object storage system.

20 Claims, 10 Drawing Sheets

SYSTEMS AND METHODS FOR GEOMETRIC PARTITIONING IN OBJECT STORAGE

TECHNICAL FIELD

The disclosure herein relates to object storage systems, particularly relates to an object storage system storing objects with geometric partition.

BACKGROUND

With almost everyone carrying a smartphone that has a camera, photos and videos are being uploaded to the Internet constantly. All cloud-based computing platforms have to implement object storage systems to store vast amount of photos and videos, as well as other documents. A modern object storage system usually includes many storage nodes to provide redundancy (e.g., back-up in case one node fails) and fast access (e.g., parallel access to multiple nodes to reduce overall latency). Redundant Array of Inexpensive Disks (RAID) has been used in the industry for a long time to ensure that the data is resilient on disk and is able to tolerate the loss of an entire disk in the array or even multiple disks in the array without data loss. However, as drive capacities increase and as newer software defined workloads are utilized in datacenters, RAID as a data protection technology for storage systems is becoming less practical and does not scale very well.

Erasure coding is the newer data protection technology for protecting storage systems and data. The term "erasure code" refers to any scheme of encoding and partitioning data into fragments that allows data recovery even when a few fragments are missing. However, as with any emerging technology, an erasure coding-based object storage system still faces many challenges and still in need of improvements.

SUMMARY

Disclosed herein is a method and the method may comprise: receiving an object for storing in an erasure coding object storage system and partitioning the object into a plurality of chunks. The plurality of chunks may include a first chunk and a second chunk. The first chunk may have a first chunk size and fall into a first bucket. The second chunk may have a second chunk size and fall into a second bucket, the second chunk size may be equal to the first chunk size multiplied by a ratio q that is larger than one. The method may further comprise encoding the first bucket to generate an encoded first bucket using a regenerating code with the first chunk size, encoding the second bucket to generate an encoded second bucket using the regenerating code with the second chunk size and storing the encoded first bucket and the encoded second bucket in a plurality of nodes of the erasure coding object storage system.

Disclosed herein is a computing system. The computing system may comprise a computing device having a central processing unit (CPU) and a plurality of storage devices serving as data and parity nodes in an erasure coding object storage system. The CPU may be configured to: receive an object for storing in an erasure coding object storage system and partition the object into a plurality of chunks. The plurality of chunks may include a first chunk and a second chunk. The first chunk may have a first chunk size and fall into a first bucket. The second chunk may have a second chunk size and fall into a second bucket, the second chunk size may be equal to the first chunk size multiplied by a ratio q that is larger than one. The CPU may be further configured to encode the first bucket to generate an encoded first bucket using a regenerating code with the first chunk size, encode the second bucket to generate an encoded second bucket using the regenerating code with the second chunk size and store the encoded first bucket and the encoded second bucket in a plurality of nodes of the erasure coding object storage system.

Disclosed herein is one or more computer-readable non-transitory media comprising one or more instructions that when executed by a processor is to configure the processor to cause the performance of operations comprising: receiving an object for storing in an erasure coding object storage system and partitioning the object into a plurality of chunks. The plurality of chunks may include a first chunk and a second chunk. The first chunk may have a first chunk size and fall into a first bucket. The second chunk may have a second chunk size and fall into a second bucket, the second chunk size may be equal to the first chunk size multiplied by a ratio q that is larger than one. The operations may further comprise encoding the first bucket to generate an encoded first bucket using a regenerating code with the first chunk size, encoding the second bucket to generate an encoded second bucket using the regenerating code with the second chunk size and storing the encoded first bucket and the encoded second bucket in a plurality of nodes of the erasure coding object storage system.

DETAILED DESCRIPTION

Figure 1:
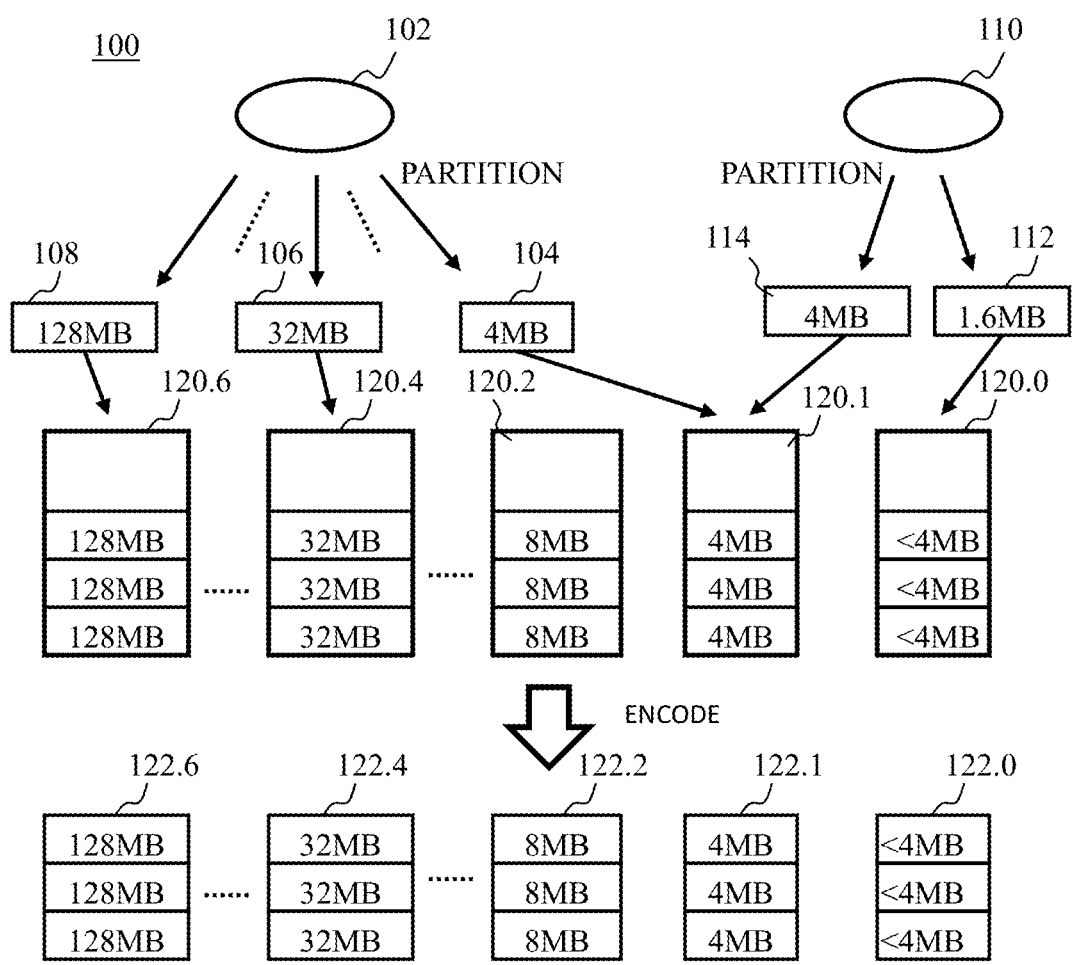
FIG. 1 schematically shows a partitioning scheme for an erasure coding object storage system in accordance with an embodiment of the present disclosure.

Specific embodiments according to the present disclosure will now be described in detail with reference to the accompanying figures. Like elements in the various figures are denoted by like reference numerals for consistency.

A storage system should be able to recover data in case one or more storage devices in the storage system fails. Recovery of storage systems takes different approaches based on the different technologies used. For example, a replication-based system can recover simply by copying data from a back-up or a mirror storage device. Erasure coding storage systems, however, may regenerate the lost data from what's left on the still available storage devices. In general, an erasure code may generate r pieces of parity from k pieces of data and such a code may also be referred to as a (k,r) code. The parity pieces may also be referred to simply as parities and may have a same size as each of the corresponding data pieces (e.g., the data pieces based on which they are generated from). As used herein, k pieces of data and r pieces of parity may be referred to as "corresponding" to each other because they are related by generating the parity pieces from the data pieces and for recovery of lost piece(s) among them. Embodiments according to the present disclosure may partition an object into a plurality of chunks with different chunk sizes and encode different chunks with same or different erasure codes with their respective chunk sizes.

The present disclosure provides systems and methods for an erasure coding object storage system. FIG. 1 schematically shows a partitioning scheme for objects to be stored in an erasure coding storage system 100 according to an embodiment. The erasure coding object storage system 100 may be configured with a plurality of buckets 120.0 through 120.N for object partitions (e.g., chunks) with different chunk sizes and these buckets containing the chunks may be encoded respectively bucket by bucket. In some embodiments, the chunk sizes for the buckets 120.1 through 120.N may be a geometric sequence $s_0 q^{i-1}$, with an initial value $s_0$, a common ratio q and the lowercase letter "i" being an integer of one to N. And the bucket 120.0 may be a bucket for small size chunks or small size objects that may have a size less than $s_0$. In the example shown in FIG. 1, the initial value $s_0$ may be 4 megabyte (MB), q may be 2 and N may be 6, thus the bucket 120.0 may be designated for any chunk or object with a size less than 4 MB, the bucket 120.1 may be designated for any chunk with a size equal to 4 MB (e.g., with i=1), the bucket 120.2 may be designated for any chunk with a size equal to 8 MB (e.g., with i=2), the bucket 120.4 may be designated for any chunk with a size equal to 32 MB (e.g., with i=4), the bucket 120.6 may be designated for any chunk with a size equal to 128 MB (e.g., with i=6). For simplicity, the buckets 120.3 and 120.5 are not shown (with dotted lines indicating that some buckets may be omitted for simplicity). It should be noted that the sequence used in FIG. 1 is one non-limiting example used for illustration and various embodiments may use other sequences, with a different initial value, a different common ratio, different N, or combination of different parameters that define the geometric sequence.

As shown in FIG. 1, an object 102 may be partitioned into a plurality of chunks that include a first chunk 104 of 4 MB, a second chunk 106 of 32 MB and a third chunk 108 of 128 MB. The first chunk 104, the second chunk 106 and third chunk 108 may be put into the buckets 102.1, 120.4 and 120.6, respectively. It should be noted that the object 102 may have other partitions that are not shown. For example, the object 102 may also have chunks of sizes of 8 MB, 16 MB and 64 MB, respectively, and may have more than one chunk for any size. In another example, an object 110 may be partitioned into a plurality of chunks including a first chuck 112 of 1.6 MB and a second chunk 114 of 4 MB. The first chunk 112 may be put into the bucket 120.0 and the second chunk 114 may be put into the bucket 120.1.

In various embodiments, an object with a total size of S may be partitioned and represented in the equation of $$S = R + \sum_{i=1}^{n} a_i s_0 q^{i-1},$$

with R being the smallest chunk with a chunk size less than the initial value $s_0$ (e.g., a residual chunk or R=S mod $s_0$), the lowercase "n" being the number of buckets in the geometric sequence that the object may have chunks fall into. For example, for object 102 in FIG. 1, with the initial value $s_0$ being 4 MB and the common ratio being 2, the partitioned chunks 104, 106 and 108 may be represented as $4 \times 2^{1-1}$, $4 \times 2^{4-1}$, $4 \times 2^{6-1}$. It should be noted that the partitioned chunks of object 102 may also include other chunks not shown, which may be in the same bucket as the chunks 104, 106 or 108, or in one or more other buckets. Chunks 112 and 114 of object 110 may also be represented in the equation with R being 1.6 MB and $a_1$ being one.

In some embodiments, each of the buckets 120.0 through 120.6 may be stored separately as one respective file on storage devices and therefore, each such file may contain chunks from different objects. These files may be encoded separately by themselves to generate the encoded buckets 122.0 through 122.6. For example, the bucket 120.0 may be encoded to generate an encoded bucket 122.0, the bucket 120.1 may be encoded to generate an encoded bucket 122.1, and so on. It should be noted that each of the encoded buckets may spread out among multiple storage devices (e.g., disks) in the storage system. For example, if a bucket is encoded with a (10; 4) code, the encoded bucket may be stored in 10 data nodes and 4 parity nodes in the storage system. In some embodiments, the erasure codes used for encoding these buckets may not be the same. For example, in one embodiment, some of the buckets may be encoded with one erasure code, one or more buckets may be encoded with a different erasure code.

For objects smaller than the initial value $s_0$, they may be put in the first bucket 120.0 without any partitioning. Thus, for the example with the initial value $s_0$ being 4 MB, the first bucket 120.0 may be designated for chunks and objects with a size smaller than 4 MB and may be referred to as a small size bucket.

Figure 2A:
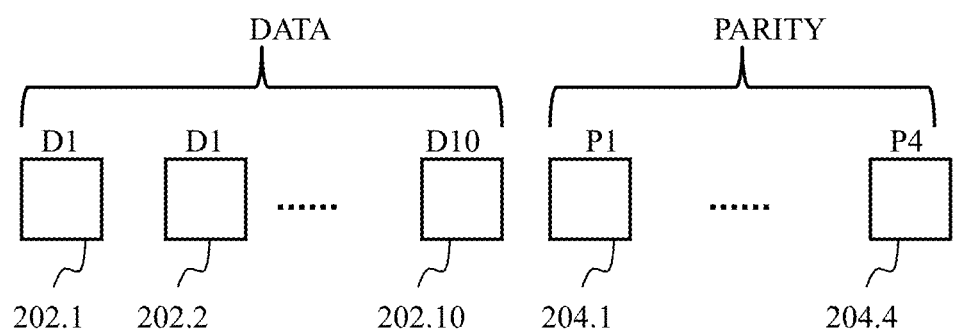
FIG. 2A schematically shows a first encoding scheme in accordance with an embodiment of the present disclosure.

FIG. 2A schematically shows a first encoding scheme in accordance with an embodiment of the present disclosure. The first encoding scheme may use an erasure code that is scalar and a Maximum Distance Separable (MDS) code, for example, but not limited to, the Reed-Solomon (RS) code. In the example shown in FIG. 2A, the number "k" may be 10 and the number "r" may be 4. The data pieces may be stored in a plurality of data nodes D1 202.1 through D10 202.10 and parities generated by the encoding process may be stored in a plurality of parity nodes P1 204.1 through P4 204.4. This (10, 4) code may be just an example and different embodiments may use codes with different k, r numbers.

Each of the nodes (e.g., data node or parity node) of FIG. 2A may be a storage device (e.g., disk or non-volatile memory) in a multi-node storage system. When up to four nodes fail, to recover one piece of data or parity (e.g., one data chunk) in one failed node, data pieces and parity pieces of the same size (e.g., same size of chunks) from 10 remaining available nodes may be used to generate the data piece or parity piece stored in the failed node. This process may be time-consuming and involves significant disk input/output (I/O) and network traffic if the size of the data piece or parity piece is large. In various embodiments, the first encoding scheme may be applied to the bucket 120.0. That is, chunks and objects with a size less than the initial value so may be encoded with the first encoding scheme.

Figure 2B:
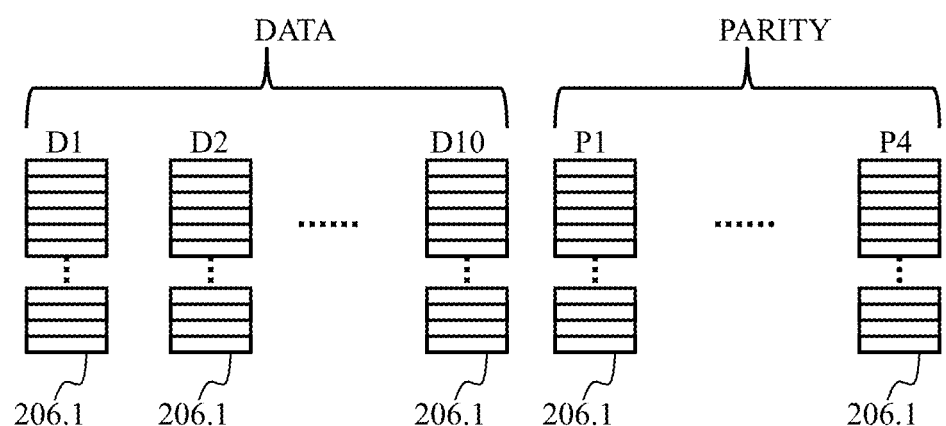
FIG. 2B schematically shows a second encoding scheme in accordance with an embodiment of the present disclosure.

FIG. 2B schematically shows a second encoding scheme in accordance with an embodiment of the present disclosure. The second encoding scheme may use an erasure code that is known as regenerating codes, for example, but not limited to, Minimum Storage Regenerating (MSR) codes, Minimum Bandwidth Regenerating (MBR) codes, Hitchhiker code, Simple Regenerating codes. In the example shown in FIG. 2B, the number "k" may be 10 and the number "r" may be 4. The data pieces may be stored in a plurality of data nodes D1 206.1 through D10 206.10 and parities generated by the encoding process may be stored in a plurality of parity nodes P1 208.1 through P4 208.4. This (10, 4) code may be only an example and different embodiments may use codes with different k, r numbers.

The second encoding scheme of FIG. 2B may have a recovery pattern different from the first encoding scheme of FIG. 2A. The second encoding scheme may break a data chunk into multiple sub-chunks (e.g., one data piece into multiple sub-pieces). When a node fails, not all sub-chunks from d nodes may be needed during data repair, in which d may be larger than k (e.g., d>k). That is, for the second encoding scheme, a portion of a chunk may be needed for data repair. This is different from the first encoding scheme, which may need whole chunks from surviving nodes for data repair. Breaking each data chunk into a number of sub-chunks to be stored in a node is called sub-packetization and the number of sub-chunks broken into by one data chunk may be denoted as alpha ($\alpha$). The sub-chunks for one data chunk may each have a size that is equal to one alpha-th (e.g., $1/\alpha$) of the original data chunk. For example, if $\alpha$ is 128, then each sub-chunk has a size of $1/128$ of the original data chunk; if $\alpha$ is 256, each sub-chunk has a size of $1/256$ of the original data chunk. Each parity chunk may have the same number of sub-chunks as a corresponding data chunk and the size of each sub-chunk may be the same as a sub-chunk of a corresponding data chunk. The number of sub-chunks required from each of "d" available nodes during a recovery for regenerating a missing data or parity chunk in the failed node may be denoted as beta ($\beta$). In various embodiments, $\beta$ may be a fraction of $\alpha$, and thus only a portion of a chunk is needed from the surviving nodes for a recovery. Because d is larger than k, the second encoding scheme may need data from more nodes in the second encoding scheme than in the first encoding scheme.

It should be noted that although one data chunk or parity chunk may be "broken" into alpha sub-chunks, these alpha sub-chunks may be continuously stored. In various embodiments, the second encoding scheme may be applied to the buckets 120.1 through 120.N. That is, data chunks or objects with a size being equal to one or multiple of the initial value so may be encoded with the second encoding scheme.

FIGS. 3A-3D show a recovery pattern for the second encoding scheme in an erasure coding object storage system in accordance with an embodiment of the present disclosure. The data chunk 302 shown in FIGS. 3A-3D may be encoded with a regenerating code, such as but not limited to a MSR code (e.g., a Clay (10, 4) code), where d=13, $\alpha$=256 and $\beta$=64. Therefore, the data chunk 302 may comprise 256 sub-chunks. Because it is a (10, 4) erasure code, there may be 10 data nodes (e.g., the data nodes 206.1 through 206.10 in FIG. 2B) and 4 parity nodes (e.g., the parity nodes 206.1 through 206.4 in FIG. 2B). Each data node may store data chunks each comprising 256 sub-chunks. Each parity node may parity chunks each also comprising 256 sub-chunks. Because d is 13 and $\beta$ is 64, when one node fails, to recover one chunk of data (or parity) from the failed node, 64 sub-chunks from 13 remaining nodes may be needed.

Figure 3A:
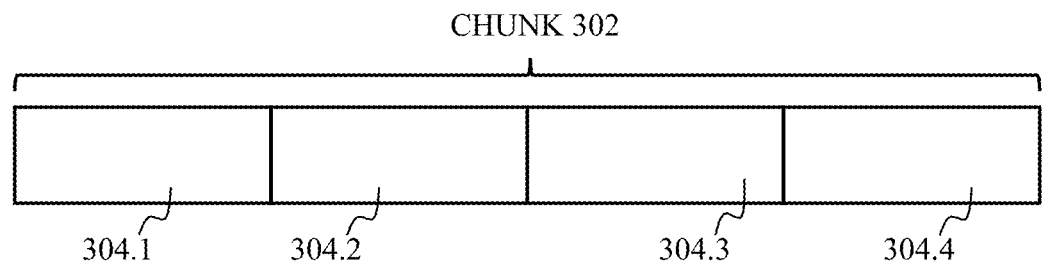
FIGS. 3A-3D schematically a recovery pattern for an erasure coding object storage system in accordance with an embodiment of the present disclosure.

In some embodiments, out of the a sub-chunks, which $\beta$ sub-chunks are needed for recovery may be different based on which node is the failed node. In one embodiment, the 10 data nodes and 4 parity nodes for the (10, 4) code used in the FIGS. 3A-3D may be grouped into four groups based on which sub-chunks are needed for repair. Group one for the recovery pattern of the regenerating (10, 4) code may include nodes D1 to D4. FIG. 3A shows that the 256 sub-chunks of one chunk 302 may be grouped into four blocks of 64 continuous sub-chunks (e.g., 304.1, 306.2, 306.3 and 306.4). If D1 in group one fails, the first block 304.1 of 64 continuous sub-chunks from each of the remaining 13 nodes may be needed to regenerate the corresponding whole chunk in D1. If D2 in group one fails, the second block 304.2 of 64 continuous sub-chunks from each of the remaining 13 nodes may be needed to regenerate the corresponding whole chunk in D2. If D3 in group one fails, the third block 304.3 of 64 continuous sub-chunks from each of the remaining 13 nodes may be needed to regenerate the corresponding whole chunk in D3. And if D4 in group one fails, the fourth block 304.4 of 64 continuous sub-chunks from each of the remaining 13 nodes may be needed to regenerate the corresponding whole chunk in D4.

Figure 3B:
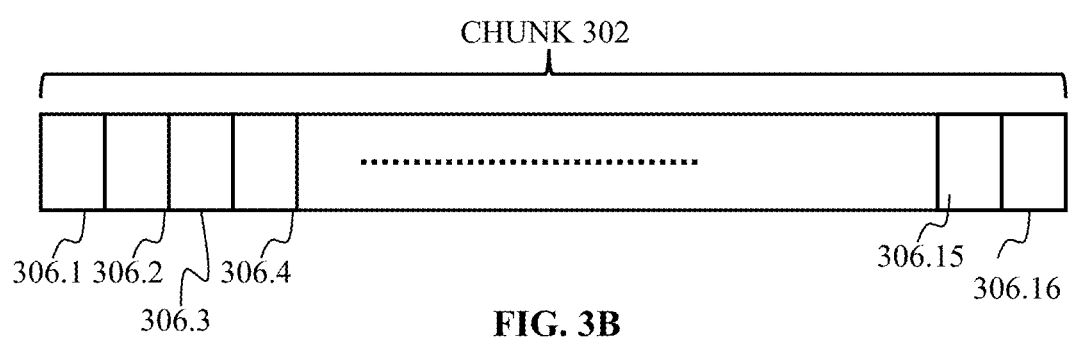

Group one may be the only group that a recovery may be performed by reading one block of 64 continuous sub-chunks. For groups two, three and four, the recovery may need to read data (or parity) in strides. That is, the needed 64 sub-chunks are not continuous. FIG. 3B shows that the 256 sub-chunks of the chunk 302 may be grouped into 16 blocks of 16 continuous sub-chunks (e.g., 306.1 through 306.16 but with only 306.1 through 306.4 and 306.15 and 306.16 marked). In an embodiment, the group two for the recovery pattern of regenerating (10, 4) code may include nodes D5 to D8 and recovery may need four stripes of 16 continuous sub-chunks. If D5 in group two fails, every 4th 16 continuous sub-chunks starting from the first block 306.1 (e.g., $1^{st}$, $5^{th}$, $9^{th}$, and $13^{th}$ blocks of 16 continuous sub-chunks) from each of the remaining 13 nodes may be needed to regenerate the corresponding whole chunk in D5. If D6 in group two fails, every 4th 16 continuous sub-chunks starting from the second block 306.2 (e.g., $2^{nd}$, $6^{th}$, $10^{th}$ and $14^{th}$ blocks of 16 continuous sub-chunks) from each of the remaining 13 nodes may be needed to regenerate the corresponding whole chunk in D6. If D7 in group two fails, every 4th 16 continuous sub-chunks starting from the third block 306.3 (e.g., $3^{rd}$, $7^{th}$, $11^{th}$ and $15^{th}$ blocks of 16 continuous sub-chunks) from each of the remaining 13 nodes may be needed to regenerate the corresponding whole chunk in D7. And if D8 in group two fails, every 4th 16 continuous sub-chunks starting from the fourth block 306.4 (e.g., $4^{th}$, $8^{th}$, $12^{th}$ and $16^{th}$ blocks of 16 continuous sub-chunks) from each of the remaining 13 nodes may be needed to regenerate the corresponding whole chunk in D8.

Figure 3C:
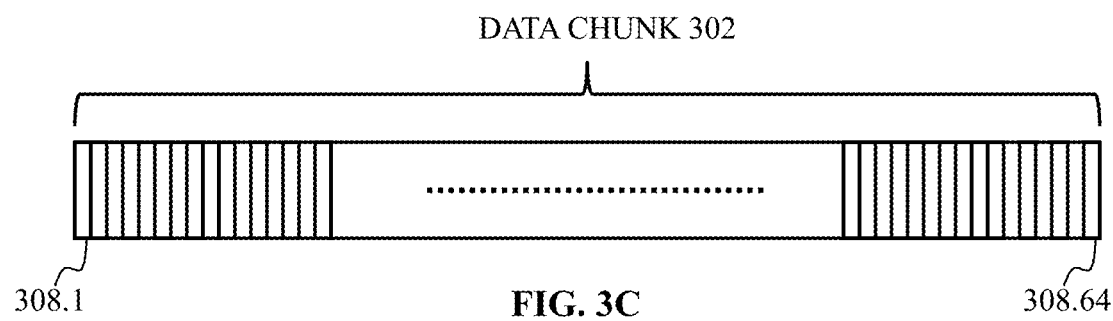

FIG. 3C shows that the 256 sub-chunks of the chunk 302 may be grouped into 64 blocks of 4 continuous sub-chunks (e.g., 308.1 through 308.64 with only 308.1 and 308.64 shown). In an embodiment, the group three for the recovery pattern of regenerating (10, 4) code may include nodes D9, D10, P1 and P2 and recovery may need 16 stripes of 4 continuous sub-chunks. If D9 in group three fails, every 4th 4 continuous sub-chunks starting from the first block 308.1 (e.g., $1^{st}$, $5^{th}$, $9^{th}$, and so on to $61^{st}$ blocks of 4 continuous sub-chunks) from each of the remaining 13 nodes may be needed to regenerate the corresponding whole chunk in D9. If D10 fails, every 4th 4 continuous sub-chunks starting from the second block 308.2 (e.g., $2^{nd}$, $6^{th}$, $10^{th}$ and so on to $62^{nd}$ blocks of 4 continuous sub-chunks) from each of the remaining 13 nodes may be needed to regenerate the corresponding whole chunk in D10. If P1 fails, every 4th 4 continuous sub-chunks starting from the third block 308.3 (e.g., $3^{rd}$, $7^{th}$, $11^{th}$ and so on to $63^{rd}$ blocks of 4 continuous sub-chunks) from each of the remaining 13 nodes may be needed to regenerate the corresponding whole chunk in P1. And if P2 fails, every 4th 4 continuous sub-chunks starting from the fourth block 308.4 (e.g., $4^{th}$, $8^{th}$, $12^{th}$ and so on to $64^{th}$ blocks of 4 continuous sub-chunks) from each of the remaining 13 nodes may be needed to regenerate the corresponding whole chunk in P2.

Figure 3D:
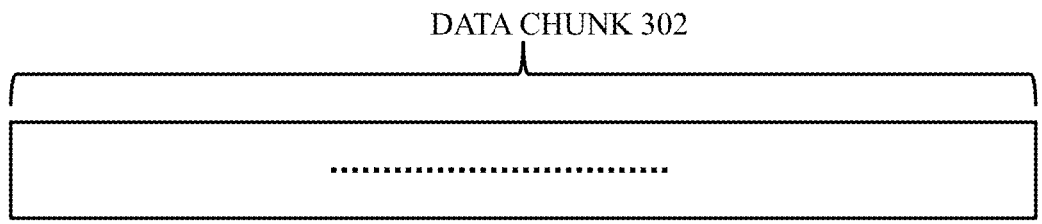

FIG. 3D shows that there is no grouping among the 256 sub-chunks of the chunk 302. In an embodiment, for the recovery pattern of regenerating (10, 4) code the group four for the recovery pattern of regenerating (10, 4) code may include nodes P3 and P4 and recovery may need 64 separated sub-chunks. If P3 fails, every 4th sub-chunk starting from the first sub-chunk of the 256 sub-chunks (e.g., $1^{st}$, $5^{th}$, $9^{th}$, and so on to $253^{rd}$ sub-chunks) from each of the remaining 13 nodes may be needed to regenerate the corresponding whole chunk in P3. If P4 fails, every 4th sub-chunk starting from the second sub-chunk of the 256 sub-chunks from each of the remaining 13 nodes (e.g., $2^{nd}$, $6^{th}$, $10^{th}$, and so on to $254^{th}$ sub-chunks) may be needed to regenerate the corresponding whole chunk in P4.

As shown in FIGS. 3B-3D, the second encoding scheme that uses a regeneration code may encounter fragmented read to recover data lost in a node that is not in group one. In group 3, the strides become smaller than group 2 strides and the data to be read is more fragmented than in group 2. Group 4 is even worse, with 64 discontinuous reads needed to recover a single chunk.

In general, a small value for alpha or beta may be preferred because this may provide better locality. For example, given $\alpha=64$ and $\beta=16$, there will be 16 discontinuous sub-chunks in each node during data recovery in the worst case. Reducing the parameters to $\alpha=16$ and $\beta=4$, the disk I/O may remain the same (the data needed during recovery being the same), but the number of discontinuous sub-chunks in the worst case may be reduced to 4.

There may be two important operations for erasure codes: (i) degraded reads to temporarily unavailable objects (e.g., system maintenances, network failures, or yet recovered object), (ii) recovery of a crashed disk or a failed node. Though regenerating codes may greatly reduce the amount of data to be read, they introduce fragmentation and discontinuous reads. For example, if one node in group 3 fails, to repair a chunk, 64 sub-chunks may be read, which is 16 discontinuous reads, and the I/O size of each read is the size of 4 sub-chunks. If the I/O size is 4 KB, the corresponding chunk size will be 4 KB×64=256 KB. For one node in group 4, the corresponding chunk size may be as large as 1 MB. Any chunk size smaller than that may result in reduced performance.

The requirement for chunk size may be even higher with the use of hard drive disks (HDDs). For an HDD, the I/O size needs to be as large as 4 MB (the corresponding chunk size is 256 MB for a group 3 node) to amortize I/O latency and utilize disk bandwidth. However, it's infeasible to increase chunk size indefinitely, because a large chunk size increases degraded read latency. An object storage system contains objects with various sizes, from several KBs to multiple GBs. If no partitioning is implemented, with a 256 MB chunk size, an erasure coding object storage system may need to repair the whole 256 MB chunk only to recover a 64 MB object in that chunk, which may lead to a high degraded read latency. In fact, degraded read requests whose sizes are smaller than chunk size may lead to additional disk reads. This phenomenon may be referred to as read amplification. A smaller chunk size may reduce read amplification at the cost of increased disk read discontinuity. Recovery efficiency, however, is not affected by read amplification because recovery is at the granularity of chunks instead of objects.

Figure 4A:
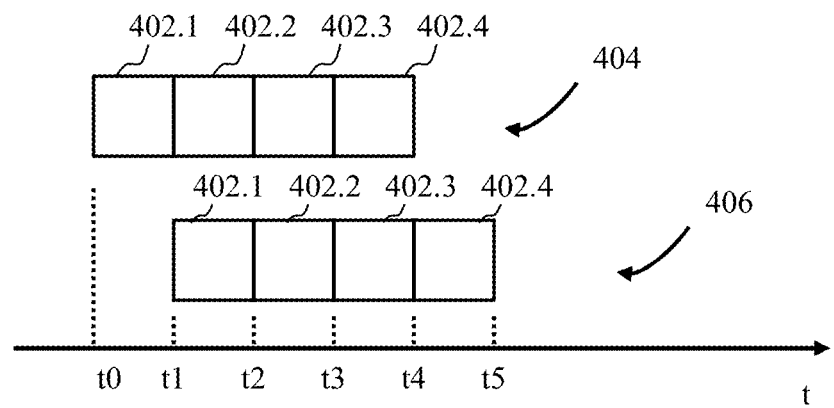
FIGS. 4A-4B schematically shows pipelining in an erasure coding object storage system in accordance with an embodiment of the present disclosure.
Figure 4B:
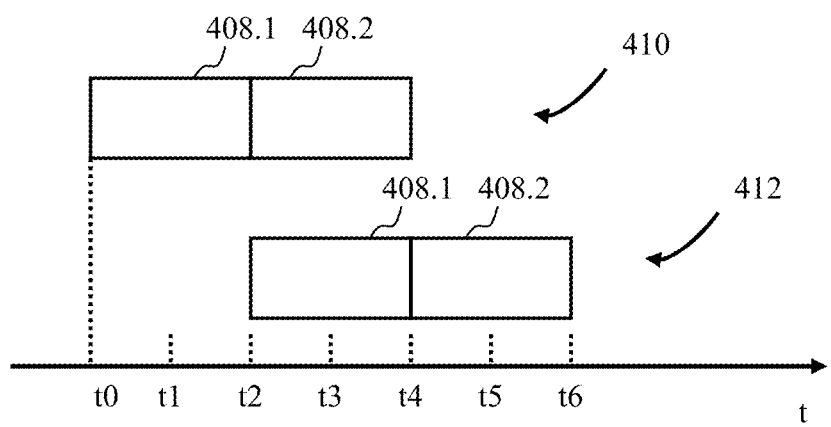

Another factor that may impact degraded read latency is pipelining. FIGS. 4A and 4B schematically show the effect of the time needed for regenerating lost chunks and transfer of the regenerated chunks in an erasure coding object storage system in accordance with an embodiment of the present disclosure. As shown in FIG. 4A, a plurality of chunks 402.1 through 402.4 may be regenerated after a node failure in a recovery process 404 and transferred in a transfer process 406. In an embodiment, the recovery process 404 may be the process of reading data and/or parity chunks from surviving nodes and regenerate the chunks in the failed node, and the transfer process 406 may be the process of delivering the repaired chunks to a client (e.g., an end user on the Internet).

As indicated by time marks t0, t1, t2, t3, t4 and t5 on the horizontal time axis, the chunk 402.1 may be regenerated in the time interval t0 to t1 and transferred in the time interval t1 to t2, the chunk 402.2 may be regenerated in the time interval t1 to t2 and transferred in the time interval t2 to t3, the chunk 402.3 may be regenerated in the time interval t2 to t3 and transferred in the time interval t3 to t4, and the chunk 402.4 may be regenerated in the time interval t3 to t4 and transferred in the time interval t4 to t5. Therefore, as one chunk is being regenerated, a previous chunk may be in transfer.

FIG. 4B may show a plurality of chunks 408.1 through 408.2 may be regenerated after a node failure in a recovery process 410 and transferred in a transfer process 412. In an embodiment, the recovery process 410 may be the process of reading data and/or parity chunks from other available nodes and regenerate the chunks in the failed node, and the transfer process 412 may be the process of delivering the repaired chunks to an end user (e.g., through the Internet to a browser). The time marks t0, t1, t2, t3, t4 and t5 on the horizontal time axis may be the same as in FIG. 4A. The time mark t6 is later than the time mark t5 and mark the end of transfer of the chunk 408.2. As shown in FIG. 4B, each of the chunks 408.1 and 408.2 may take a longer time to regenerate and transfer compared to the chunks 402.1 through 402.4. In one embodiment, this may be because the chunks 408.1 and 408.2 may have a size larger than that of the plurality of chunks 402.1 through 402.4. Therefore, in various embodiments, latency may be reduced by dividing a large object into smaller data pieces (e.g., smaller data chunks) thus enabling dividing the whole repair process and transfer process into multiple small steps and pipelining the small steps of repair and transfer.

In various embodiments, the first encoding scheme (e.g., RS code) applied to the small size bucket may support pipelining in FIG. 4A naturally. However, for regenerating codes used in the second encoding scheme, pipelining may require partitioning an object into multiple small chunks, with which disk read may be discontinuous. On the other hand, with a large chunk size, it may take a long time to wait for the repairing of the first chunk. This can be a severe problem when the chunk size is large, as each object may span few chunks. For example, if the initial value is 256 MB, all objects smaller than 256 MB are one chunk and fall into the small size bucket.

Figure 5:
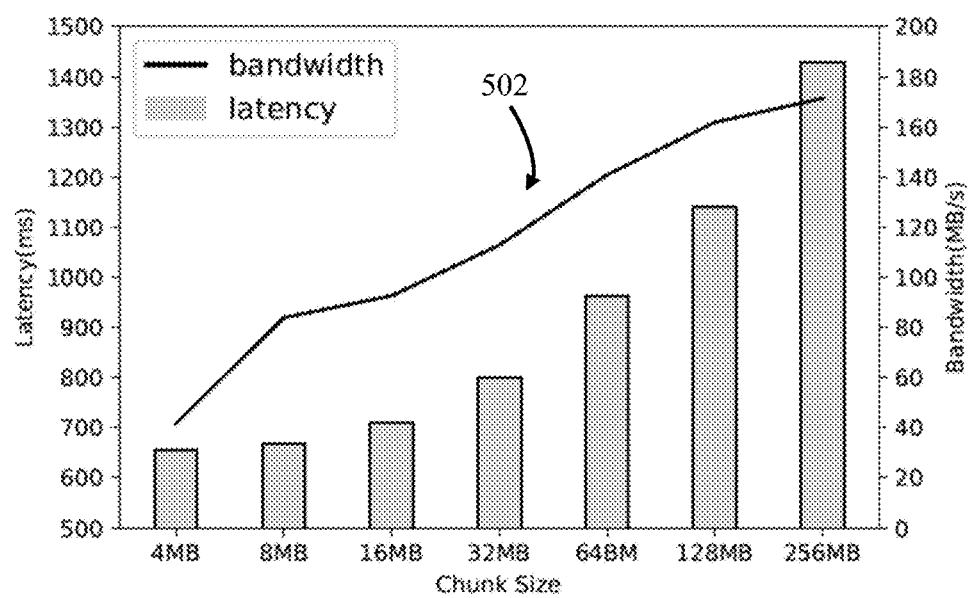
FIG. 5 shows a trade-off between degraded read latency and recovery efficiency at different chunk sizes in accordance with an embodiment of the present disclosure.

There is a trade-off between degraded read latency and recovery efficiency with the chunk size playing a key factor. A large chunk size may reduce discontinuous reads, which improves recovery efficiency, but at the same time causes more severe read amplification and inefficient pipelining, leading to longer degraded read latency. A relatively small chunk size may be beneficial to degraded read latency, at the cost of reduced recovery efficiency due to more serious fragmentation. FIG. 5 shows the trade-off between degraded read latency and recovery efficiency at different chunk sizes for a Clay (10,4) code. The average disk read bandwidth may be used to measure recovery efficiency because it can measure the effect of discontinuous read quantitatively. When a chunk has a size larger than an object's size, the extra repaired data will be discarded. The multiple bars for different chunk sizes may show that the latency (e.g., the left vertical axis) for a client to read a 64 MB object over a 1 Gbps network increases from 700 ms to over 1,300 ms when the chunk size is increased from 4 MB to 256 MB, but the curve 502 may show that the disk read bandwidth (e.g., the right vertical axis) increases from about 40 MB/s to over 170 MB/s.

Embodiments according to the present disclosure may partition an object into chunks with different sizes. Small chunks (e.g., in the small size bucket) may be encoded using the first encoding scheme to reduce degraded read latency through pipelining. Larger chunks may be encoded using the second encoding scheme to achieve efficient continuous sequential reads. Thus, embodiments may enjoy the benefits of both small and large chunk sizes.

Figure 6:
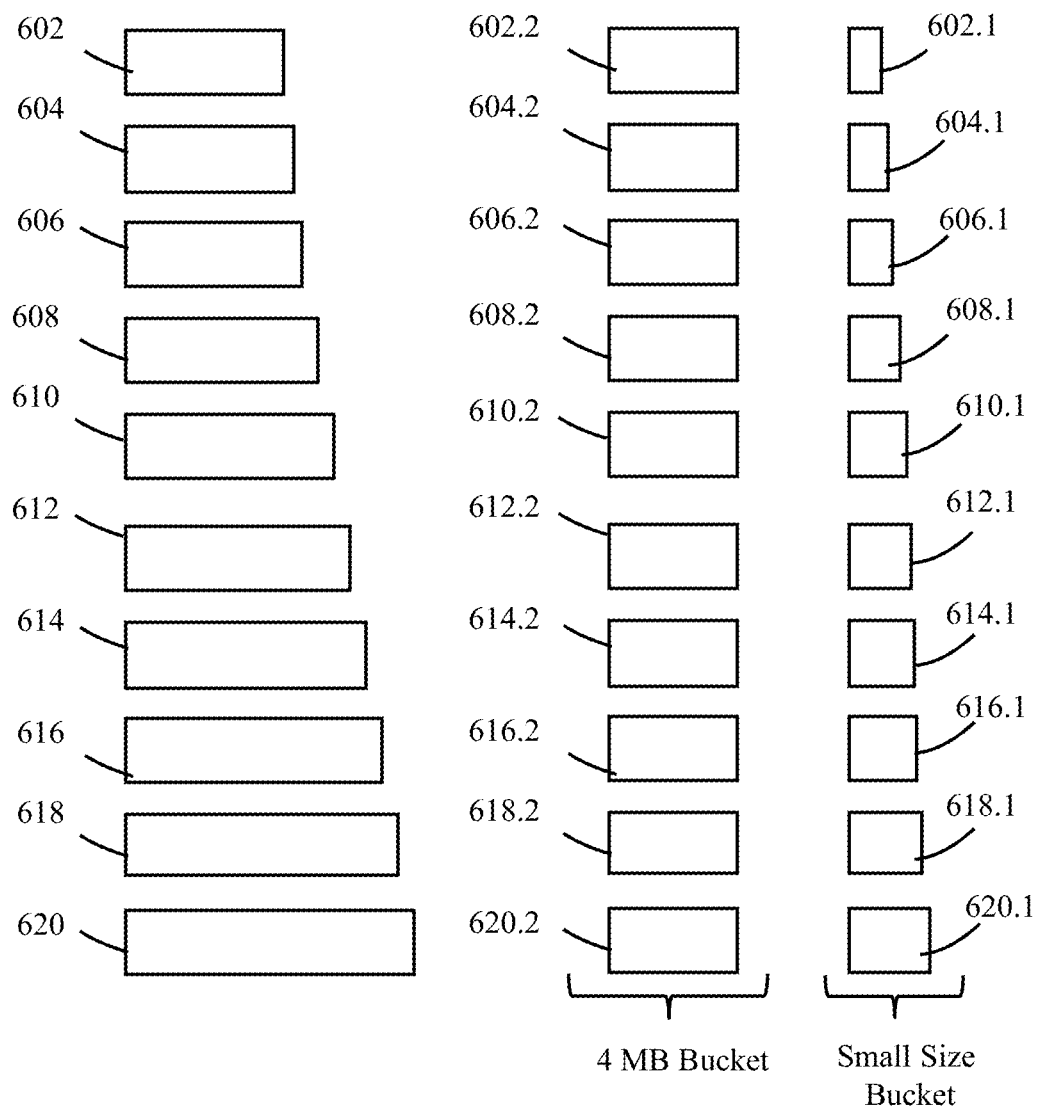
FIG. 6 shows exemplary partitioning and bucketing multiple objects in one erasure coding storage system in accordance with an embodiment of the present disclosure.

In at least one embodiment, one approach to do the partition may cut a front portion from an object such that the remaining portion has a size that is equal to the initial value of so or multiple so. This approach may be referred to as a front cut in one or more embodiments. The front portion may be put into the small size bucket and repaired first in a recovery process. Because the remaining size of the object is a multiple of so, as long as so is large enough (e.g., 4 MB), it may be much easier to find a chunk with the same size. FIG. 6 shows exemplary partitioning and bucketing of multiple objects in one erasure coding storage system in accordance with one embodiment. There may be 10 objects 602, 604, 606, 608, 610, 612, 614, 616, 618 and 620 with sizes 5.1 MB, 5.2 MB, 5.3 MB, 5.4 MB, 5.5 MB, 5.6 MB, 5.7 MB, 5.8 MB, 5.9 MB and 6 MB, respectively. Without partitioning, these 10 objects have different sizes and cannot be grouped together using a regenerating code to encode. But in an embodiment with the initial value so as 4 MB, these 10 objects may be portioned with 10 front portions 602.1, 604.1, 606.1, 608.1, 610.1, 612.1, 614.1, 616.1, 618.1, and 620.1 with sizes of 1.1 MB, 1.2 MB, 1.3 MB, 1.4 MB, 1.5 MB, 1.6 MB, 1.7 MB, 1.8 MB, 1.9 MB and 2 MB respectively. And these objects may each have a remaining portion 602.2, 604.2, 606.2, 608.1, 610.1, 612.1, 614.1, 616.1, 618.1 and 620.1 all having the same size of 4 MB. The 10 front portions may be put into a small size bucket designated for chunk sizes less than the initial value so and encoded using the first encoding scheme (e.g., RS code), which does not have a specific chunk size or need any alignment. The 10 remaining portions may be grouped together in a 4 MB bucket and encoded using the second encoding scheme (e.g., a (10, 4) Clay code).

Objects that are smaller than $s_0$ may be put into the small-size-bucket directly. Unlike other buckets, there isn't a specific bucket size for the small-size-bucket, and the object or chunk sizes in small-size-bucket may be different. The small size bucket may be encoded using the first encoding scheme (e.g., RS code), so read amplification may be eliminated for read inside the small size bucket. In most storage systems, storage capacity may be dominated by larger objects. For example, one survey shows that in large storage systems, more than 97:7% of storage capacity is consumed by objects larger than 4 MB. The storage capacity consumed by the small size bucket may be small with a proper selection of so, which means that the disk and network traffic incurred by the recovery of small size bucket may be small. This implies that the small size bucket may have limited impact on recovery efficiency in an embodiment.

In general, larger chunk size may improve recovery efficiency. Theoretically, the best way to store objects is no partition, so that chunk sizes are maximal. However, without partitioning, degraded read latency on large objects may suffer due to lack of pipelining. Partition of larger objects into smaller chunks with different sizes may help pipelining in a more efficient way, but embodiments may still try to put most bytes of an object into larger chunks. In at least one embodiment, three techniques may be employed: (i) start to repair from a small chunk size to avoid unnecessary waiting for repairing the first chunk and progress from smaller chunks to larger chunks, (ii) limit the ratio of adjacent chunk sizes (e.g., $$\frac{s_i}{s_{i-1}}$$

with $s_i$ being the i-th size of partitioned chunks) so that the repair of current chunk can predate the transfer of previous chunk, (iii) employ largest possible chunk sizes under the last constrain.

Figure 7A:
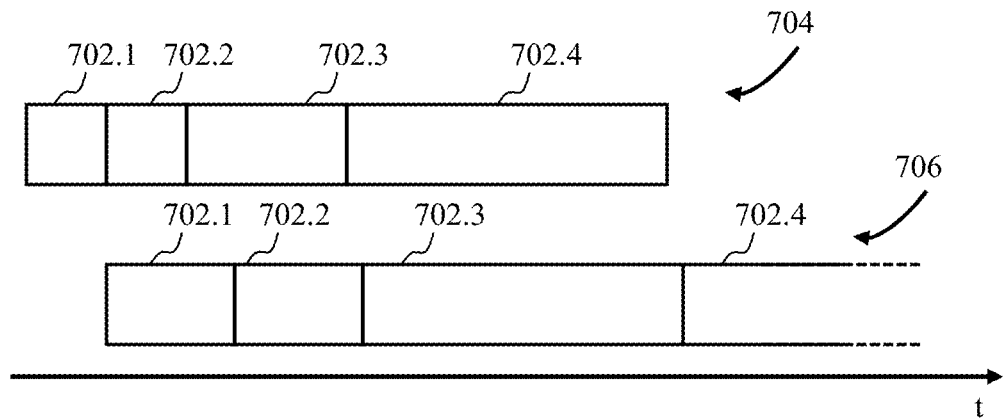
FIGS. 7A-7B schematically shows partitioning and pipelining in an erasure coding object storage system in accordance with an embodiment of the present disclosure.
Figure 7B:
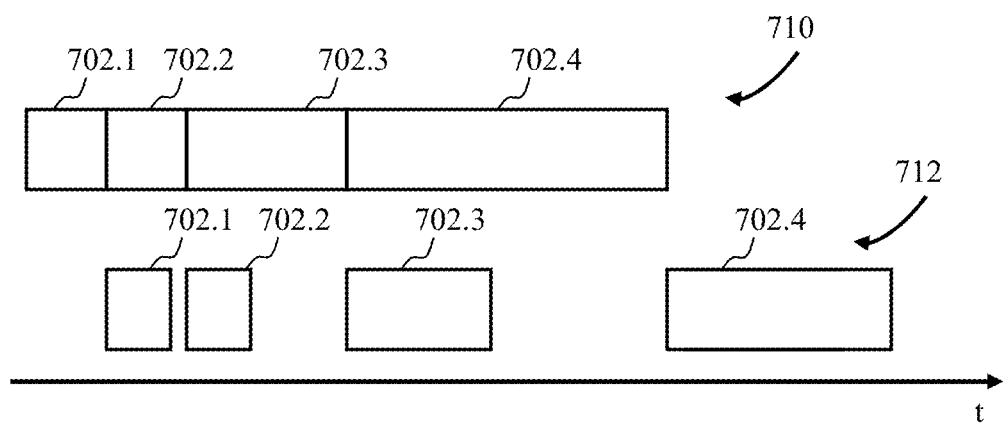

The above three techniques may be embodied in the geometric partition in at least one embodiment with the chunk sizes growing exponentially. An object received by an exemplary erasure coding storage system may be front cut and the remaining portion of the object may be partitioned into chunks with sizes forming a geometric sequence starting from the initial value so of the geometric sequence. FIGS. 7A and 7B schematically show how a geometrically partitioned object may be repaired and transferred in an erasure coding object storage system in accordance with an embodiment of the present disclosure. With reference to FIG. 7A, an object may be partitioned into four chunks 702.1, 702.2, 702.3 and 702.4 with sizes 4 MB, 4 MB, 8 MB and 16 MB, respectively. The chunks 702.1 through 702.4 may be repaired after a node failure in a recovery process 704 and transferred in a transfer process 706. In an embodiment, the recovery process 704 may be the process of reading data and/or parity chunks from other available nodes and regenerate the chunks in the failed node, and the transfer process 706 may be the process of delivering the repaired chunks to a client (e.g., an end user on the Internet). In an embodiment, as shown in FIG. 7A, the chunks may be processed from smaller ones to larger ones so that the client may start to receive repaired chunks quickly. The storage system may try to deliver the repaired object to the client as soon as the first portion is reconstructed. Regeneration of subsequent chunks may be performed while the previous chunk is being transferred. In the embodiment shown in FIG. 7A, the transfer speed may be slower than the repair speed. That is, a chunk may take less time to be repaired than to be transferred. FIG. 7A may show that the degraded read latency may be close to transfer time when transfer of a chunk is slower than repairing the chunk.

FIG. 7B shows the four chunks 702.1 through 702.4 may be repaired after a node failure in a recovery process 710 and transferred in a transfer process 712. In contrast to the example in FIG. 7A, the recovery process 710 may be slower while the transfer process 712 may be faster. That is, the transfer speed in the transfer process 712 may be faster than the repair speed for each chunk in the recovery process 710. As shown in FIG. 7B, when transfer is faster, though not optimal, the pipelining of geometric partitioning may still help to reduce degraded read latency.

Besides the benefit of pipelining, geometric bucket sizes may also facilitate large objects to put most of their data in buckets with large chunk sizes, resulting in better efficiency. By using a geometric sequence, instead of an arithmetic sequence or a constant sequence, the number of partitioned chunks may be limited to the logarithm of the object size, rather than linear or polynomial to the object size. This may help to increase average chunk size. However, not all kinds of partition can help pipelining. For instance, assuming s0=4 MB and q=2, if a 20 MB object is partitioned into two chunks with 4 MB and 16 MB respectively, these 2 chunks may not be properly pipelined because their size gap is huge, and thus may result in latency penalty. Therefore, embodiments of the present disclosure may try to make the coefficient of each chunk size non-zero (e.g., $a_i \neq 0$ for every "i" up to the largest chunk of the series of chunks). That is, from the smallest chunk size to the largest chunk size of partitioned chunks for one object, there is no gap from 1 to n, with the lowercase "n" being the number of buckets the object partitions fall into. It should be noted that the uppercase "N" may be used to refer to an upper limit of the geometric sequence for an erasure coding object storage system while the lowercase "n" may be used to refer to upper limit of number of buckets of the geometric sequence an object may fall into. If the coefficient of each chunk is non-zero, the size gap between adjacent chunks may be small and resulting in a situation similar to FIG. 7A or 7B.

Figure 8:
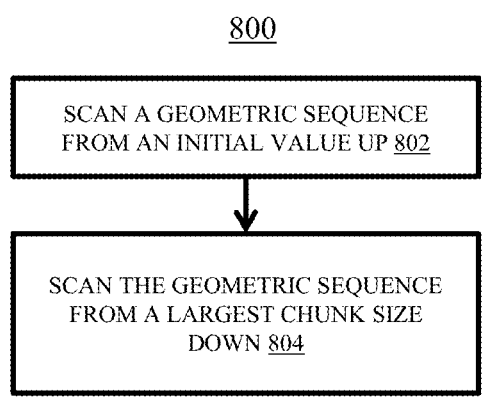
FIG. 8 is a flow diagram for finding the chunk sizes for an object in accordance with an embodiment of the present disclosure.

FIG. 8 shows a process 800 to find chunk sizes to partition an object in accordance with an embodiment of the present disclosure. At block 802, a geometric sequence may be scanned from an initial value up. During the first scan the geometric sequence may be scanned from the initial value up by subtracting chunk sizes corresponding values of the geometric sequence until a remaining size of the object is less than a largest chunk size $s_0 q^{n-1}$. For example, the process 800 may subtract the size of every bucket in a geometric sequence until the remaining size is too small to be filled into a current bucket. The first scan may also be referred to as a first pass. At block 804, the geometric sequence may be scanned from the largest chunk size down. During the second scan the geometric sequence may be scanned from the largest chunk size down to the initial value by subtracting chunk sizes corresponding values of the geometric sequence until what's left is less than the initial value $s_0$. This second scan may use a greedy policy, trying to choose the largest possible chunk size until no bucket can be filled. The second scan may be referred to as a second pass. In an embodiment, the process 800 may be referred to as a two-pass scan and implemented as an algorithm. An exemplary implementation of the algorithm may be shown in pseudo-code as follows, with the object size being S, and the result including a number "n" for the number of values in the geometric sequence and coefficients for each chunk size corresponding to a value in the geometric sequence:

```
begin
i←1;
while S≥s₀qⁱ⁻¹ do
{aᵢ←1;
  S←S−s₀qⁱ⁻¹;
  i←i+1;
}
n←i;
while i≥1
{while S≥s₀qⁱ⁻¹ do
  {S←S−s₀ qⁱ⁻¹;
    aᵢ←aᵢ+1;
  }
  i←i+1;
}
R=S;
```

For example, suppose the size of an object is 73.5 MB. The first pass may find chunk sizes of 4 MB, 8 MB, 16 MB and 32 MB. And the remaining size may be split as 8 MB+4 MB+1.5 MB in the second pass. Thus, the final partitioning sizes may be 1.5 MB+2×4 MB+2×8 MB+16 MB+32 MB. In the partitioning process, the 1.5 MB may be cut at the front of the object to implement the front cut technique as described herein.

Embodiments implementing geometric partitioning may have two parameters so and q to tune. A larger so may result in larger chunk sizes, thereby reducing repair time and increasing recovery efficiency. However, a larger so may also add overhead to pipelining since the first chunk may not be pipelined, increasing degraded read latency. In some embodiments, so may be set based on the hardware and workload. Moreover, in some embodiments, the common ratio "q" may be set to a small number, so that it may be easier for repair to predate transfer. In the examples of this disclosure the common ratio is set to 2, which is convenient to implement and may facilitate pipelining and help have larger chunk sizes. In other embodiments, the common ratio is not limited to 2 and other numbers may be used.

Figure 9:
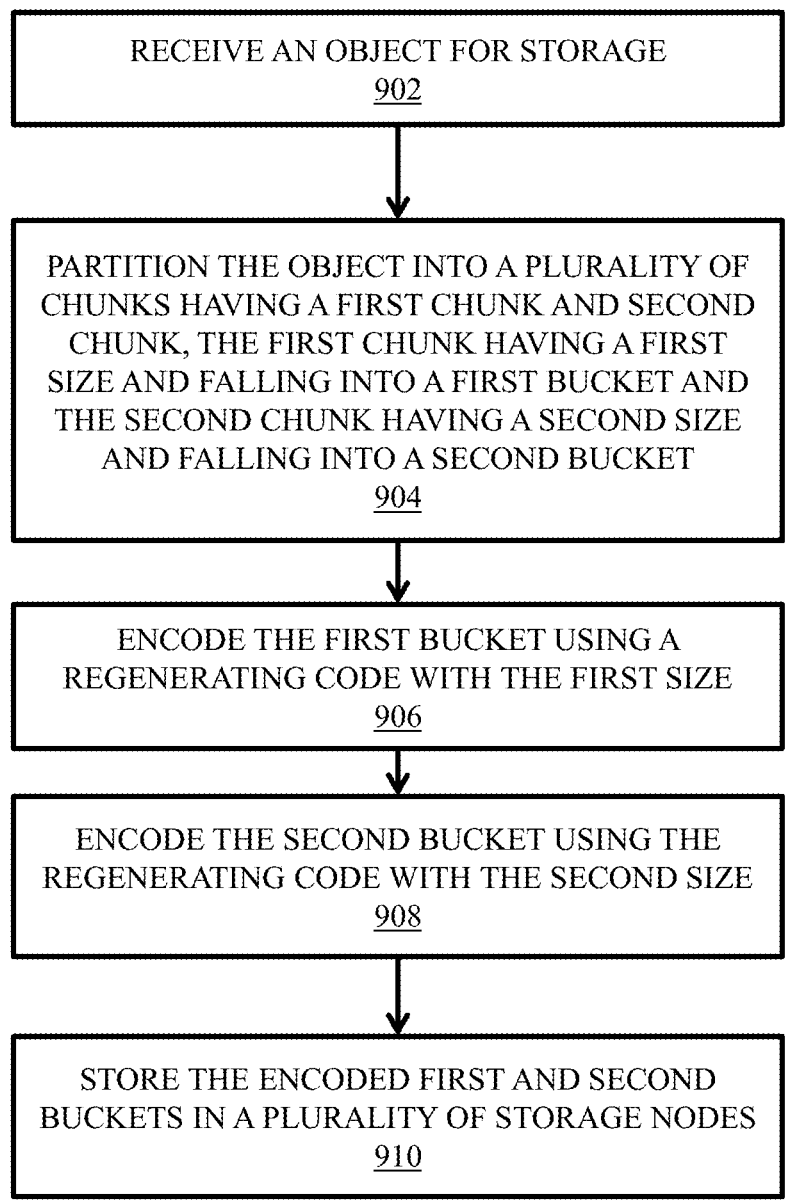
FIG. 9 is a flow diagram for storing an object in an erasure coding object storage system in accordance with an embodiment of the present disclosure.

FIG. 9 shows a flow chart for a process 900 to store an object in an erasure coding object storage system according to an embodiment. In block 902, an object may be received for storing in an erasure coding object storage system. In block 904, the object may be partitioned into a plurality of chunks. The plurality of chunks may include a first chunk and a second chunk. The first chunk may have a first chunk size and fall into a first bucket, the second chunk may have a second chunk size and fall into a second bucket. The second chunk size may be equal to the first chunk size multiplied by a ratio q that is larger than one.

For example, as described herein, an object of size 73.5 MB may be partitioned into a plurality of chunks (e.g., 1.5 MB+2×4 MB+2×8 MB+16 MB+32 MB) using a two-pass scan to obtain the chunk sizes. A first chunk may be one of the 4 MB chunks and a second chunk may be one of the 8 MB chunks. The first bucket may be the 4 MB bucket 120.1 shown in FIG. 1 and the second bucket may be the 8 MB bucket 120.2 shown in FIG. 1. The second chunk size 8 MB may be equal to the first chunk size 4 MB multiplied by a ratio of 2. Or a first chunk may be one of the 8 MB chunks and the second chunk may be the 16 MB chunk, and the second chunk size 16 MB may be equal to the first chunk size 8 MB multiplied by a ratio of 2. The first bucket may be the 8 MB bucket 120.2 shown in FIG. 1 and the second bucket may be the 16 MB bucket 120.3.

In block 906, the first bucket may be encoded to generate a first encoded bucket using a regenerating code with the first chunk size. In block 908, the second bucket may be encoded to generate a second encoded bucket using the regenerating code with the second chunk size. When neither the first bucket nor the second bucket is a small size bucket, they may be encoded using the second encoding scheme with regenerating codes (e.g., Minimum Storage Regenerating (MSR) codes, Minimum Bandwidth Regenerating (MBR) codes, Hitchhiker code, Simple Regenerating codes) and their respective chunk sizes. In one embodiment, the regenerating code may be a Clay code. In some other embodiments, the first bucket and the second bucket may be encoded with different regenerating codes. In block 908, the encoded first bucket and the encoded second bucket may be stored in a plurality of nodes of the erasure coding object storage system. In various embodiment, the number of nodes in an erasure coding object storage system may depend on the regenerating code used. For example, if the encoding is performed using a (10, 4) code, at least 14 nodes may be needed for data and parities for each of the encoded buckets.

Figure 10:
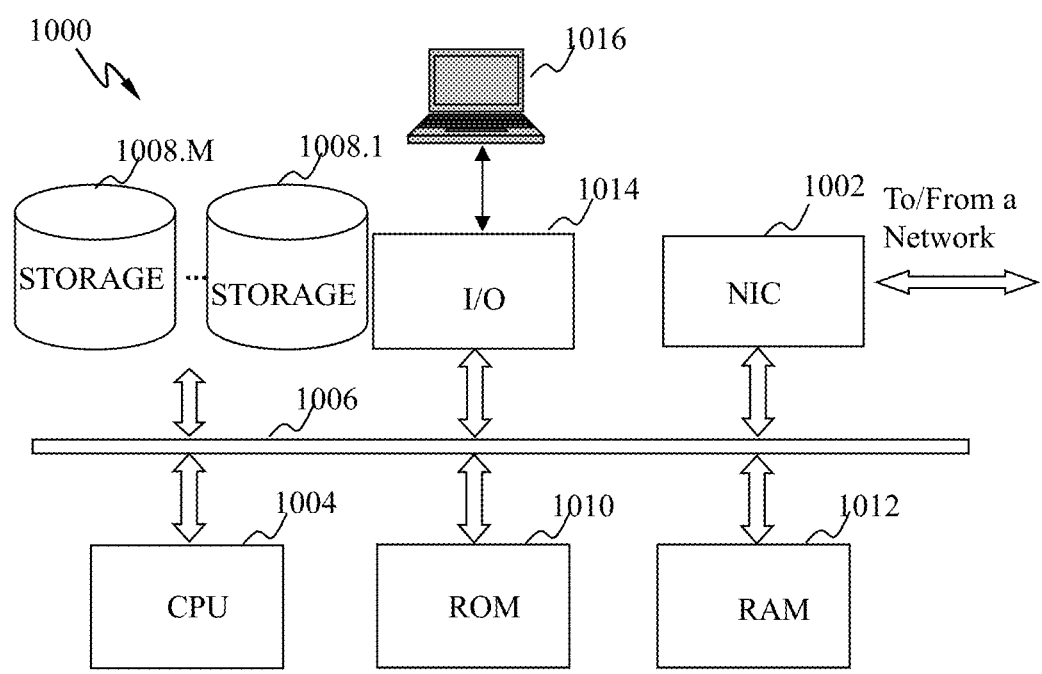
FIG. 10 depicts a general computer architecture in accordance with an embodiment of the present disclosure on which the present teaching can be implemented.

FIG. 10 is a functional block diagram illustration for a computing device 1000 on which the present teaching may be implemented. The computing device may be a general-purpose computer or a special purpose computer, including but not limited to, a personal computer, a laptop, a server computer, a tablet, a smartphone. The methods and operations as described herein, e.g., in FIGS. 7-8, may each be implemented on one or more computers such as the computing device 1000, via hardware, software program, firmware, or a combination thereof. In an embodiment, the computing device 1000 may be used as a machine for administrating or implementing the erasure coding object storage system as described herein. Although only one such computer is shown, for convenience, a distributed computing system may include a plurality of server machines implemented on a number of similar platforms to distribute the processing load from a plurality of clients.

The computing device 1000, for example, may include one or more network interface cards (NICs) 902 connected to and from a network connected thereto to facilitate data communications. The computing device 1000 may also include a CPU 1004, in the form of one or more processors (e.g., single core or multi-core), for executing program instructions (e.g., to perform the operations and processes described herein). The exemplary computer platform may further include an internal communication bus 1006, program storage and data storage of different forms, e.g., a plurality of storage devices 1008.1 through 1008.M, read only memory (ROM) 1010, or Random Access Memory (RAM) 1012, for various data files to be processed and/or communicated by the computer, as well as possibly program instructions to be executed by the CPU 1004. The computing device 1000 may also include an I/O component 1014, supporting input/output flows between the computer and other components therein such as user interface elements 1016. The computing device 1000 may also receive programming and data via network communications. The plurality of storage devices 1008.1 through 1008.M may be used as the storage medium for an erasure coding object storage system. The storage devices 1008.1 through 1008.M may be disks, tapes, non-volatile storage devices or other types of suitable non-volatile storage device. The number M may depend on the erasure codes to be used. For example, for a (10,4) code encoded object storage system, the number M may be at least 14.

It should be noted that the computing device 1000 is one example of a computing device that may be used in an erasure coding object system according to the present disclosure. In some embodiments, the nodes of the erasure coding object system do not be attached to one machine. For example, one storage node or a few storage nodes may be attached one machine and a plurality of machines may for a machine farm with the plurality of nodes for the erasure coding object system attached to the farm. Moreover, it should be noted that although the storage devices 1008.1 through 1008.M are shown as components of the computing device 1000. In one or more embodiments, the storage devices 1008.1 through 1008.M may be connected to the computing device 1000 but not components of the computing device 1000.

Hence, aspects of the method for presenting personalized content, as outlined above, may be embodied in programming. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives and the like, which may provide storage at any time for the computer-implemented method.

All or portions of the computer-implemented method may at times be communicated through a network such as the Internet or various other telecommunication networks. Such communications, for example, may enable loading of the software from one computer or processor into another. Thus, another type of media that may bear the elements of the computer-implemented method includes optical, electrical, and electromagnetic waves, such as used across physical interfaces between local devices, through wired and optical landline networks and over various air-links. The physical elements that carry such waves, such as wired or wireless links, optical links or the like, also may be considered as media bearing the computer-implemented method. As used herein, unless restricted to tangible "storage" media, terms such as computer or machine "readable medium" refer to any medium that participates in providing instructions to a processor for execution.

Hence, a machine readable medium may take many forms, including but not limited to, a tangible storage medium, a carrier wave medium or physical transmission medium. Non-transitory storage media include, for example, optical or magnetic disks, such as any of the storage devices in any computer(s) or the like, which may be used to implement the system or any of its components as shown in the drawings. Volatile storage media include dynamic memory, such as a main memory of such a computer platform. Tangible transmission media include coaxial cables; copper wire and fiber optics, including the wires that form a bus within a computer system. Carrier-wave transmission media can take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a PROM and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

While the foregoing description and drawings represent embodiments of the present teaching, it will be understood that various additions, modifications, and substitutions may be made therein without departing from the spirit and scope of the principles of the present teaching as defined in the accompanying claims. One skilled in the art will appreciate that the present teaching may be used with many modifications of form, structure, arrangement, proportions, materials, elements, and components and otherwise, used in the practice of the disclosure, which are particularly adapted to specific environments and operative requirements without departing from the principles of the present teaching. For example, although the implementation of various components described above may be embodied in a hardware device, it can also be implemented as a firmware, firmware/software combination, firmware/hardware combination, or a hardware/firmware/software combination. The presently disclosed embodiments are therefore to be considered in all respects as illustrative and not restrictive, the scope of the present teaching being indicated by the following claims and their legal equivalents, and not limited to the foregoing description.

What is claimed is:

1. A method, comprising:
    receiving an object for storing in an erasure coding object storage system;
    partitioning the object into a plurality of chunks, the plurality of chunks including a first chunk and a second chunk, the first chunk having a first chunk size and falling into a first bucket, the second chunk having a second chunk size and falling into a second bucket, the second chunk size being equal to the first chunk size multiplied by a ratio q that is larger than one;
    encoding the first bucket to generate an encoded first bucket using a regenerating code with the first chunk size;
    encoding the second bucket to generate an encoded second bucket using the regenerating code with the second chunk size; and
    storing the encoded first bucket and the encoded second bucket in a plurality of nodes of the erasure coding object storage system.

2. The method of claim 1, wherein the object has a total size of S and the plurality of chunks with sizes satisfy an equation of:

$$S = R + \sum_{i=1}^{n} s_0 q^{i-1} a_i,$$

with $s_0 q^{i-1}$ being a geometric sequence with an initial value of $s_0$, the ration q being a common ratio of the geometric sequence, "i" being from 1 to a positive integer represented by "n" that is larger than one, $a_i$ being a coefficient representing a number of partitioned chunks with a size of $s_0 q^{i-1}$, and R being a smallest size for a smallest partitioned chunk and less than $s_0$.

3. The method of claim 2, wherein the smallest partitioned chunk is front cut and put into a small size bucket and the small size bucket is encoded with a scalar and a Maximum Distance Separable (MDS) code.

4. The method of claim 3, wherein the object is partitioned into the plurality of chunks such that smaller sized chunks are processed ahead of larger sized chunks.

5. The method of claim 2, wherein excluding the smallest partitioned chunk, all other chunks of the plurality of chunks including the first chunk and the second chunk are encoded with the regenerating code with their respective chunk sizes.

6. The method of claim 2, wherein none of the coefficient $a_i$ with "i" from 1 to n is zero.

7. The method of claim 6, wherein the coefficient $a_i$ with "i" from 1 to n is obtained by a two-pass scan of the geometric sequence, in which during a first scan the geometric sequence is scanned from the initial value up by subtracting chunk sizes corresponding values of the geometric sequence until a remaining size of the object is less than a largest chunk size $s_0 q^{n-1}$, and during a second scan the geometric sequence is scanned from the largest chunk size down to the initial value by subtracting chunk sizes corresponding values of the geometric sequence until what's left is less than the initial value $s_0$.

8. A computing system, comprising:
    a computing device having a central processing unit (CPU); and
    a plurality of storage devices serving as data and parity nodes in an erasure coding object storage system, wherein the CPU is configured to:
        receive an object for storing in the erasure coding object storage system;
        partition the object into a plurality of chunks, the plurality of chunks including a first chunk and a second chunk, the first chunk having a first chunk size and falling into a first bucket, the second chunk having a second chunk size and falling into a second bucket, the second chunk size being equal to the first chunk size multiplied by a ratio q that is larger than one;
        encode the first bucket to generate an encoded first bucket using a regenerating code with the first chunk size;
        encode the second bucket to generate an encoded second bucket using the regenerating code with the second chunk size; and
        store the encoded first bucket and the encoded second bucket in a plurality of storage devices.

9. The computing system of claim 8, wherein the object has a total size of S and the plurality of chunks with sizes satisfy an equation of:

$$S = R + \sum_{i=1}^{n} s_0 q^{i-1} a_i,$$

with $s_0 q^{i-1}$ being a geometric sequence with an initial value of $s_0$, the ration q being a common ratio of the geometric sequence, "i" being from 1 to a positive integer represented by "n" that is larger than one, $a_i$ being a coefficient representing a number of partitioned chunks with a size of $s_0 q^{i-1}$, and R being a smallest size for a smallest partitioned chunk and less than $s_0$.

10. The computing system of claim 8, wherein the smallest partitioned chunk is front cut and put into a small size bucket and the small size bucket is encoded with a scalar and a Maximum Distance Separable (MDS) code.

11. The computing system of claim 10, wherein the object is partitioned into the plurality of chunks such that smaller sized chunks are processed ahead of larger sized chunks.

12. The computing system of claim 8, wherein excluding the smallest partitioned chunk, all other chunks of the plurality of chunks including the first chunk and the second chunk are encoded with the regenerating code with their respective chunk sizes.

13. The computing system of claim 8, wherein none of the coefficient $a_i$ with "i" from 1 to n is zero.

14. The computing system of claim 13, wherein the coefficient $a_i$ with "i" from 1 to n is obtained by a two-pass scan of the geometric sequence, in which during a first scan the geometric sequence is scanned from the initial value up by subtracting chunk sizes corresponding values of the geometric sequence until a remaining size of the object is less than a largest chunk size $s_0 q^{n-1}$, and during a second scan the geometric sequence is scanned from the largest chunk size down to the initial value by subtracting chunk sizes corresponding values of the geometric sequence until what's left is less than the initial value $s_0$.

15. One or more computer-readable non-transitory media comprising one or more instructions that when executed by a processor is to configure the processor to cause the performance of operations comprising:
    receiving an object for storing in an erasure coding object storage system;
    partitioning the object into a plurality of chunks, the plurality of chunks including a first chunk and a second chunk, the first chunk having a first chunk size and falling into a first bucket, the second chunk having a second chunk size and falling into a second bucket, the second chunk size being equal to the first chunk size multiplied by a ratio q that is larger than one;
    encoding the first bucket to generate an encoded first bucket using a regenerating code with the first chunk size;
    encoding the second bucket to generate an encoded second bucket using the regenerating code with the second chunk size; and
    storing the encoded first bucket and the encoded second bucket in a plurality of nodes of the erasure coding object storage system.

16. The computer-readable non-transitory media of claim 15, wherein the object has a total size of S and the plurality of chunks with sizes satisfy an equation of:

$$S = R + \sum_{i=1}^{n} s_0 q^{i-1} a_i,$$

with $s_0 q^{i-1}$ being a geometric sequence with an initial value of $s_0$, the ration q being a common ratio of the geometric sequence, "i" being from 1 to a positive integer represented by "n" that is larger than one, $a_i$ being a coefficient representing a number of partitioned chunks with a size of $s_0 q^{i-1}$, and R being a smallest size for a smallest partitioned chunk and less than $s_0$.

17. The computer-readable non-transitory media of claim 15, wherein the smallest partitioned chunk is front cut and put into a small size bucket and the small size bucket is encoded with a scalar and a Maximum Distance Separable (MDS) code.

18. The computer-readable non-transitory media of claim 17, wherein the object is partitioned into the plurality of chunks such that smaller sized chunks are processed ahead of larger sized chunks.

19. The computer-readable non-transitory media of claim 15, wherein excluding the smallest partitioned chunk, all other chunks of the plurality of chunks including the first chunk and the second chunk are encoded with the regenerating code with their respective chunk sizes.

20. The computer-readable non-transitory media of claim 15, wherein none of the coefficient $a_i$ with "i" from 1 to n is zero, and wherein the coefficient $a_i$ with "i" from 1 to n is obtained by a two-pass scan of the geometric sequence, in which during a first scan the geometric sequence is scanned from the initial value up by subtracting chunk sizes corresponding values of the geometric sequence until a remaining size of the object is less than a largest chunk size $s_0 q^{n-1}$, and during a second scan the geometric sequence is scanned from the largest chunk size down to the initial value by subtracting chunk sizes corresponding values of the geometric sequence until what's left is less than the initial value $s_0$.

* * * * *